(12) United States Patent
Kaneko et al.

(10) Patent No.: US 12,509,795 B2
(45) Date of Patent: *Dec. 30, 2025

(54) METHOD FOR MANUFACTURING ALUMINUM NITRIDE SUBSTRATE, ALUMINUM NITRIDE SUBSTRATE, AND METHOD FOR FORMING ALUMINUM NITRIDE LAYER

(71) Applicants: KWANSEI GAKUIN EDUCATIONAL FOUNDATION, Hyogo (JP); TOYO ALUMINIUM KABUSHIKI KAISHA, Osaka (JP); TOYOTA TSUSHO CORPORATION, Aichi (JP)

(72) Inventors: Tadaaki Kaneko, Sanda (JP); Daichi Dojima, Sanda (JP); Moeko Matsubara, Osaka (JP); Yoshitaka Nishio, Osaka (JP)

(73) Assignees: KWANSEI GAKUIN EDUCATIONAL FOUNDATION, Hyogo (JP); TOYO ALUMINIUM KABUSHIKI KAISHA, Osaka (JP); TOYOTA TSUSHO CORPORATION, Aichi (JP)

( * ) Notice: Subject to any disclaimer, the term of this patent is extended or adjusted under 35 U.S.C. 154(b) by 558 days.

This patent is subject to a terminal disclaimer.

(21) Appl. No.: 17/996,189

(22) PCT Filed: Mar. 30, 2021

(86) PCT No.: PCT/JP2021/013746
§ 371 (c)(1),
(2) Date: May 16, 2023

(87) PCT Pub. No.: WO2021/210393
PCT Pub. Date: Oct. 21, 2021

(65) Prior Publication Data
US 2023/0304186 A1 Sep. 28, 2023

(30) Foreign Application Priority Data
Apr. 14, 2020 (JP) .................................. 2020-072550

(51) Int. Cl.
*C30B 23/02* (2006.01)
*C30B 23/06* (2006.01)
(Continued)

(52) U.S. Cl.
CPC .......... *C30B 23/025* (2013.01); *C30B 23/063* (2013.01); *C30B 29/403* (2013.01);
(Continued)

(58) Field of Classification Search
CPC ... C30B 23/025; C30B 23/063; C30B 29/403; H01L 21/02378; H01L 21/0243; H01L 21/0254
See application file for complete search history.

(56) References Cited

U.S. PATENT DOCUMENTS

| 6,579,359 B1 | 6/2003 | Mynbaeva et al. |
| 2010/0147211 A1 | 6/2010 | Miyanaga et al. |

(Continued)

FOREIGN PATENT DOCUMENTS

| JP | 2003-229623 A | 8/2003 |
| JP | 2007-055881 A | 3/2007 |

(Continued)

OTHER PUBLICATIONS

Hartman et al., "Photo-electron emission and atomic force microscopies of the hydrogen etched 6H—SiC(0 0 0 1) surface and the initial growth of GaN and AlN", Applied Surface Science (2005), vol. 242, No. 3-4, pp. 428-436.

(Continued)

*Primary Examiner* — Robert M Kunemund
(74) *Attorney, Agent, or Firm* — Calfee, Halter & Griswold LLP

(57) ABSTRACT

An object of the present invention is to provide a novel technique capable of manufacturing a large-diameter AlN substrate.
The present invention is a method for manufacturing an AlN substrate, including a crystal growth step S30 of forming an AlN layer 20 on a SiC underlying substrate 10 having through holes 11. In addition, the present invention is a method for forming an AlN layer including the through hole formation step S20 of forming the through holes 11 in the (Continued)

SiC underlying substrate 10 before forming the AlN layer 20 on the SiC underlying substrate 10.

18 Claims, 10 Drawing Sheets

(51) Int. Cl.
 *C30B 29/40* (2006.01)
 *H01L 21/02* (2006.01)
(52) U.S. Cl.
 CPC .... *H01L 21/02378* (2013.01); *H01L 21/0243* (2013.01); *H01L 21/0254* (2013.01)

(56) References Cited

U.S. PATENT DOCUMENTS

| | | |
|---|---|---|
| 2010/0221539 A1 | 9/2010 | Mizuhara et al. |
| 2017/0073839 A1 | 3/2017 | Mori et al. |

FOREIGN PATENT DOCUMENTS

| | | |
|---|---|---|
| JP | 2009218370 A * | 9/2009 |
| JP | 2015131744 A | 7/2015 |
| JP | 2015-166293 A | 9/2015 |
| JP | 2016-37426 A | 3/2016 |
| JP | 2018-24578 A | 2/2018 |
| JP | 2019-26500 A | 2/2019 |
| WO | 2007/111219 A1 | 10/2007 |
| WO | 2016147786 A1 | 9/2016 |

OTHER PUBLICATIONS

Kamber et al., "Lateral epitaxial overgrowth of aluminum nitride on patterned silicon carbide substrates by hydride vapor phase epitaxy", Applied Physics Letter (2007), vol. 90, No. 12, pp. 122116-1-122116-3.

Lossy et al., "Gallium nitride powerbar transistors with via holes fabricated by laser ablation", Physic Status Solidi. C: Current Topics in Solid State Physics (2006), vol. 3, No. 3, pp. 482-485.

EPO Communication and European Search Report issued in corresponding EP application No. 21789219.9 on Apr. 18, 2024 (9 pages).

English translation of International Search Report from PCT/JP2021/013746 dated Jun. 22, 2021 (3 pages).

* cited by examiner

FIG. 6
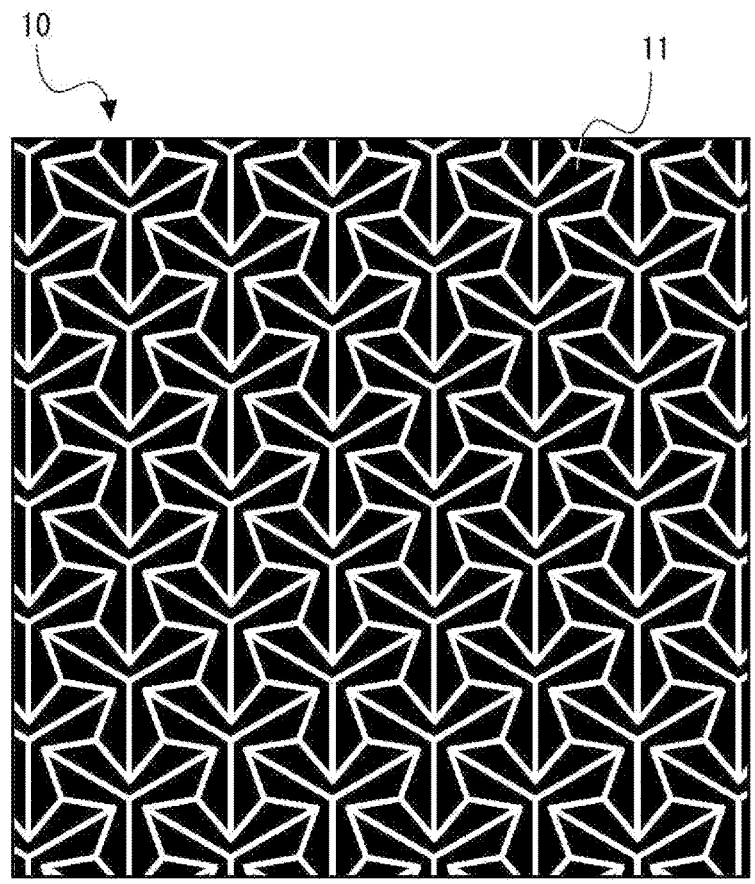
(a)
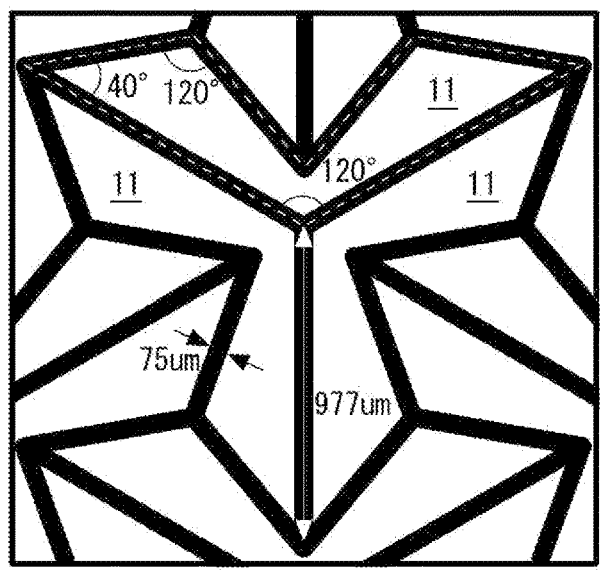
(b)

FIG. 8
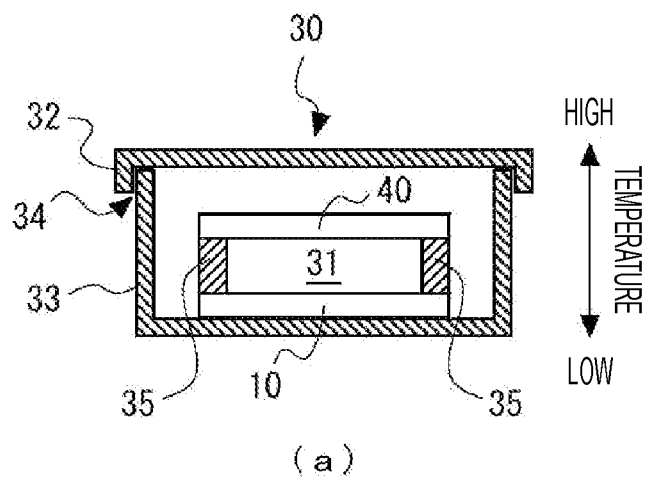
(a)
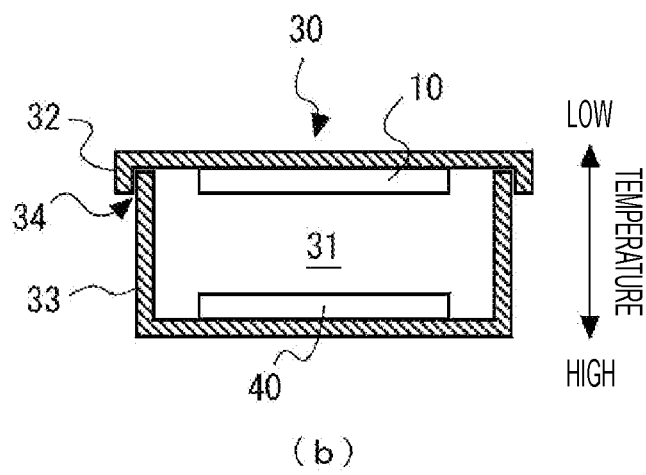
(b)
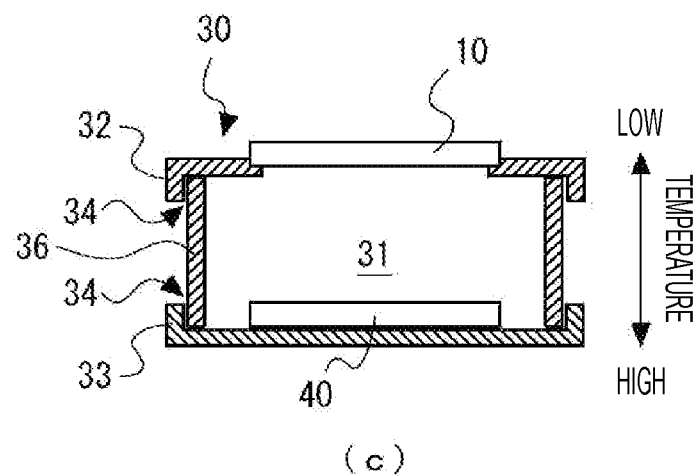
(c)

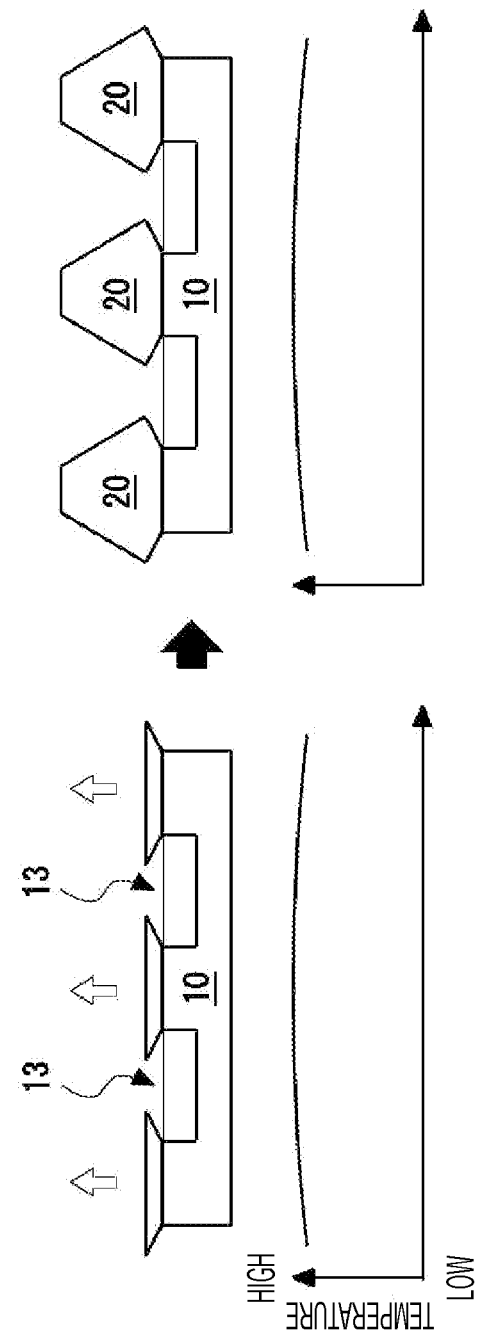

METHOD FOR MANUFACTURING ALUMINUM NITRIDE SUBSTRATE, ALUMINUM NITRIDE SUBSTRATE, AND METHOD FOR FORMING ALUMINUM NITRIDE LAYER

CROSS-REFERENCE TO RELATED APPLICATIONS

This application is a 371 of PCT Application No. PCT/JP2021/013746, filed on Mar. 30, 2021, which claims priority to Japanese Application No. 2020-072550, filed on Apr. 14, 2020, the contents of which are hereby incorporated by reference as if recited in their entirety.

TECHNICAL FIELD

The present invention relates to a method for manufacturing an aluminum nitride substrate, an aluminum nitride substrate, and a method for forming an aluminum nitride layer.

BACKGROUND ART

In general, a semiconductor substrate is manufactured by crystal-growing a growth layer on an underlying substrate. However, a problem has been reported that it is difficult to obtain a semiconductor substrate having a large diameter depending on compositions of the semiconductor material to be crystal-grown.

Examples thereof include a case where AlN crystals are grown on an underlying substrate such as an aluminum nitride (AlN) substrate or a silicon carbide (SiC) substrate via a sublimation method. When the crystals are simply grown via the sublimation method, there is a region where the AlN crystals do not grow, so that there is a problem that it is difficult to obtain a semiconductor substrate having a large diameter and excellent crystallinity.

In response to such a problem, Patent Literature 1 describes a technique of "a method for growing AlN crystals on a seed crystal substrate arranged in a crystal growth chamber in a crystal growth vessel provided in a reaction vessel via a vapor phase growth method, the method characterized in supplying a carbon-containing gas into the crystal growth chamber during crystal growth".

CITATION LIST

Patent Literature

Patent Literature 1: JP 2007-55881 A

SUMMARY OF INVENTION

Technical Problem

An object of the present invention is to provide a novel technique capable of manufacturing a large-diameter AlN substrate.

Furthermore, another object of the present invention is to provide a novel technique capable of manufacturing an AlN substrate having a large diameter and excellent crystallinity.

Solution to Problem

The present invention that is intended to solve the problems described above is a method for manufacturing an aluminum nitride substrate, including a crystal growth step of forming an aluminum nitride layer on a silicon carbide underlying substrate having through holes.

In this way, by forming the aluminum nitride layer on the silicon carbide underlying substrate having the through holes, an aluminum nitride substrate having a large diameter and excellent crystallinity can be manufactured.

In this way, by forming the aluminum nitride layer on the silicon carbide underlying substrate having the through holes, an aluminum nitride substrate having a diameter equivalent to the diameter of the silicon carbide underlying substrate can be manufactured. Therefore, by adopting a silicon carbide underlying substrate having a large diameter, an aluminum nitride substrate having a large diameter can be obtained.

Furthermore, the term "large diameter" in the present description means that an aluminum nitride layer having a large area can be obtained as compared with a case where an aluminum nitride layer is formed on a silicon carbide underlying substrate having no through holes.

In a preferred mode of the present invention, the crystal growth step is a step of heating such that a temperature gradient is formed along a vertical direction of the silicon carbide underlying substrate.

In a preferred mode of the present invention, the crystal growth step is a step in which the silicon carbide underlying substrate and the source of the aluminum nitride layer are disposed in such a way to face each other, and heating is performed such that the temperature gradient is formed between the silicon carbide underlying substrate and the source.

In a preferred mode of the present invention, the crystal growth step includes a lateral growth step of growing the aluminum nitride layer in a horizontal direction of the silicon carbide underlying substrate, and a longitudinal growth step of growing the aluminum nitride layer in a vertical direction of the silicon carbide underlying substrate.

In a preferred mode of the present invention, a through hole formation step of forming through holes in the silicon carbide underlying substrate, and a strained layer removal step of removing a strained layer introduced in the through hole formation step are further included.

In a preferred mode of the present invention, the through hole formation step is a step of forming the through holes by irradiating the silicon carbide underlying substrate with a laser.

In a preferred mode of the present invention, the strained layer removal step is a step of removing a strained layer of the silicon carbide underlying substrate by heat treatment.

In a preferred mode of the present invention, the strained layer removal step is a step of etching the silicon carbide underlying substrate under a silicon atmosphere.

Furthermore, the present invention also relates to a method for forming an aluminum nitride layer. In other words, the present invention for solving the problems described above is a method for forming an aluminum nitride layer including the through hole formation step of forming the through holes in the silicon carbide underlying substrate before forming the aluminum nitride layer on the silicon carbide underlying substrate.

In a preferred mode of the present invention, the strained layer removal step of removing a strained layer introduced in the through hole formation step is included.

In a preferred mode of the present invention, the strained layer removal step is a step of etching the silicon carbide underlying substrate by heat treatment.

Advantageous Effects of Invention

According to the technique disclosed, it is possible to provide a novel technique capable of manufacturing a large-diameter AlN substrate.

In addition, according to the technique disclosed, it is possible to provide a novel technique capable of manufacturing the AlN substrate having the large diameter and excellent crystallinity.

Other problems, features and advantages will become apparent by reading the following description of embodiments as well as understanding the drawings and claims.

BRIEF DESCRIPTION OF DRAWINGS

FIG. 6 is an explanatory view of a through hole formation step according to Example 1.

FIG. 8 is an explanatory view of a crystal growth step according to Example 1.

FIG. 10 is an explanatory view of a crystal growth step according to Comparative Example 1.

DESCRIPTION OF EMBODIMENTS

Figure 1:
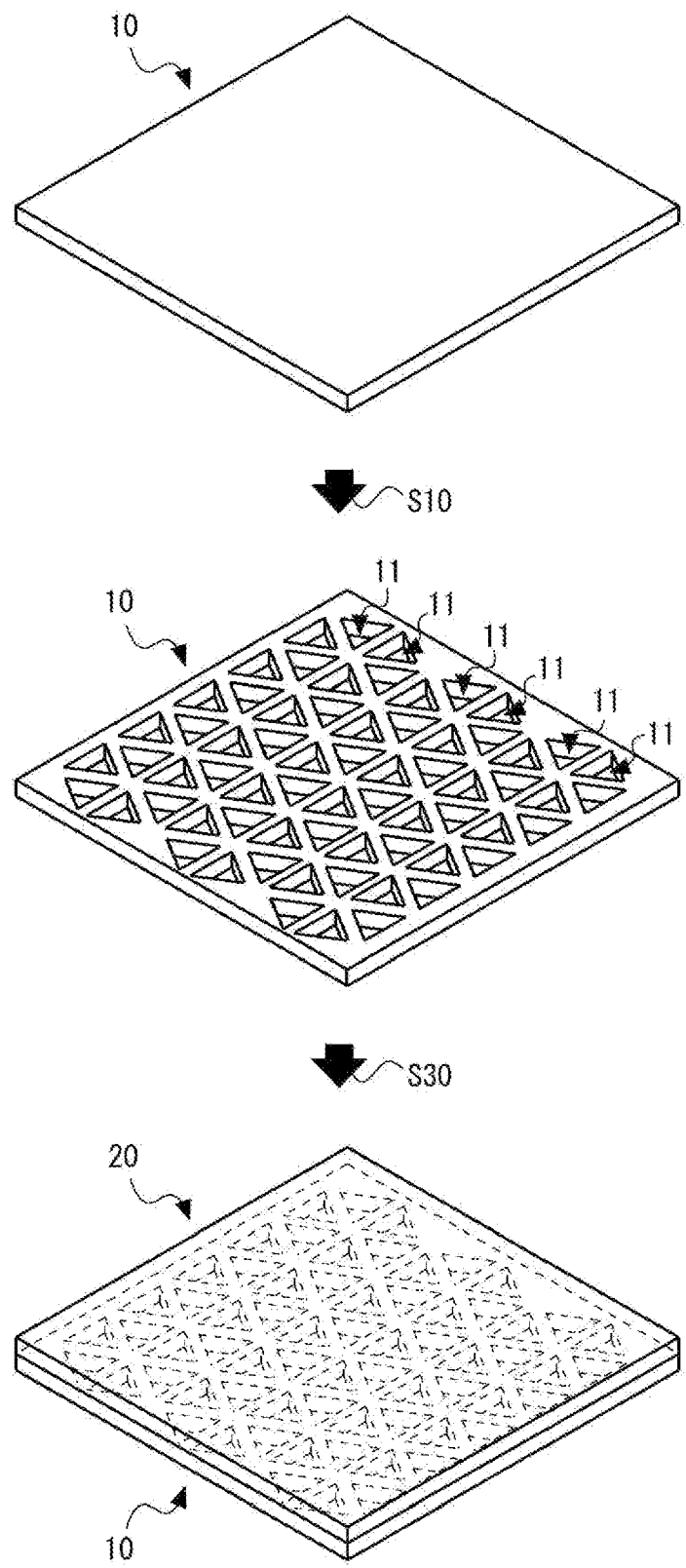
FIG. 1 is an explanatory view for explaining steps of the method for manufacturing an AlN substrate according to an embodiment.

Hereinafter, the preferred embodiments of a method for manufacturing an AlN substrate according to the present invention will be described in detail with reference to the accompanying drawings. The technical scope of the present invention is not limited to the embodiments illustrated in the accompanying drawings, and can be appropriately changed within the scope described in the claims. Furthermore, the accompanying drawings are conceptual diagrams, and the relative dimensions and the like of each member do not limit the present invention. Moreover, in the present description, for the purpose of describing the invention, upper side or lower side may be referred to as the upper or the lower side based on the upper and lower sides of the drawings, but the upper and lower sides are not limited in relation to usage modes or the like of the AlN substrate of the present invention. In addition, in the following description of the embodiments and the accompanying drawings, the same reference numerals are given to the same configurations, and redundant description is omitted.

<<Method for Manufacturing Aluminum Nitride Substrate>>

FIGS. 1 to 4 are explanatory views for explaining steps of the method for manufacturing an AlN substrate according to the embodiment of the present invention.

The method for manufacturing the AlN substrate according to the embodiment may include a through hole formation step S10 of forming through holes 11 in a SiC underlying substrate 10, a strained layer removal step S20 of removing a strained layer 12 introduced in the through hole formation step S10, and a crystal growth step S30 of forming an AlN layer 20 on the SiC underlying substrate 10 having the through holes 11.

In addition, this embodiment can be understood as a method of forming the AlN layer in a large area including the through hole formation step S10 of forming the through holes 11 in the SiC underlying substrate 10 before forming the AlN layer 20 on the surface of the SiC underlying substrate 10.

Hereinafter, each step of the embodiment will be described in detail.

<Through Hole Formation Step>

The through hole formation step S10 is a step of forming the through holes 11 in the SiC underlying substrate 10. The through hole formation step S10 can be naturally adopted as long as it is a method capable of forming the through holes 11 in the SiC underlying substrate 10.

Figure 2:
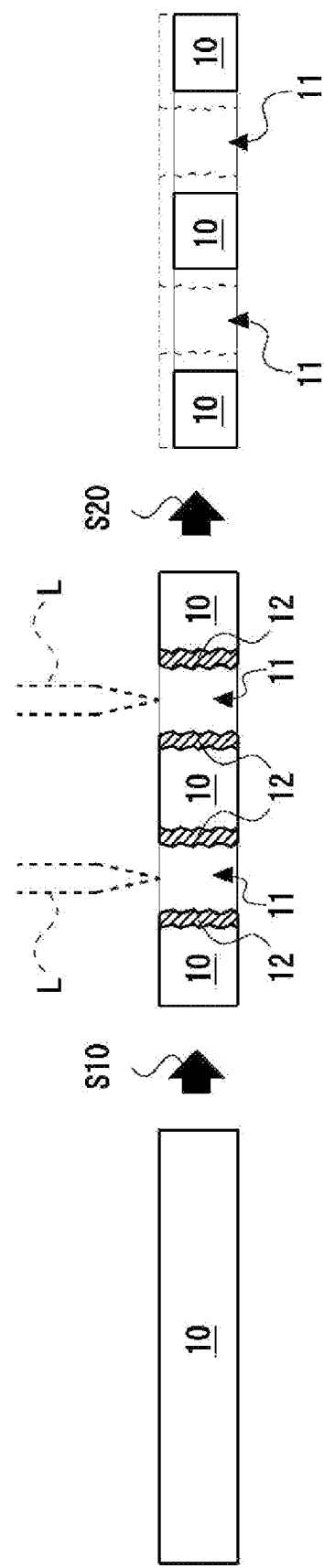
FIG. 2 is an explanatory view for explaining a through hole formation step and a strained layer removal step according to the embodiment.

As a method of forming the through holes 11, a plasma etching such as a laser processing, a focused ion beam system (FIB), and a reactive ion etching (RIE) can be adopted as an example. In addition, in FIG. 2 illustrating the present embodiment, a means for forming the through holes 11 by irradiating the SiC underlying substrate 10 with a laser L is illustrated.

In addition, as the SiC underlying substrate 10, a wafer or a substrate processed from a bulk crystal may be used, or a substrate having a buffer layer made of the semiconductor material described above may be separately used.

A shape that reduces the strength of the SiC underlying substrate 10 may be adopted for the through holes 11, and one or a plurality of through holes may be formed. In addition, a through hole group (pattern) in which a plurality of through holes 11 are arranged may be adopted.

Hereinafter, an example of a pattern when a hexagonal semiconductor material is grown will be described in detail.

Figure 3:
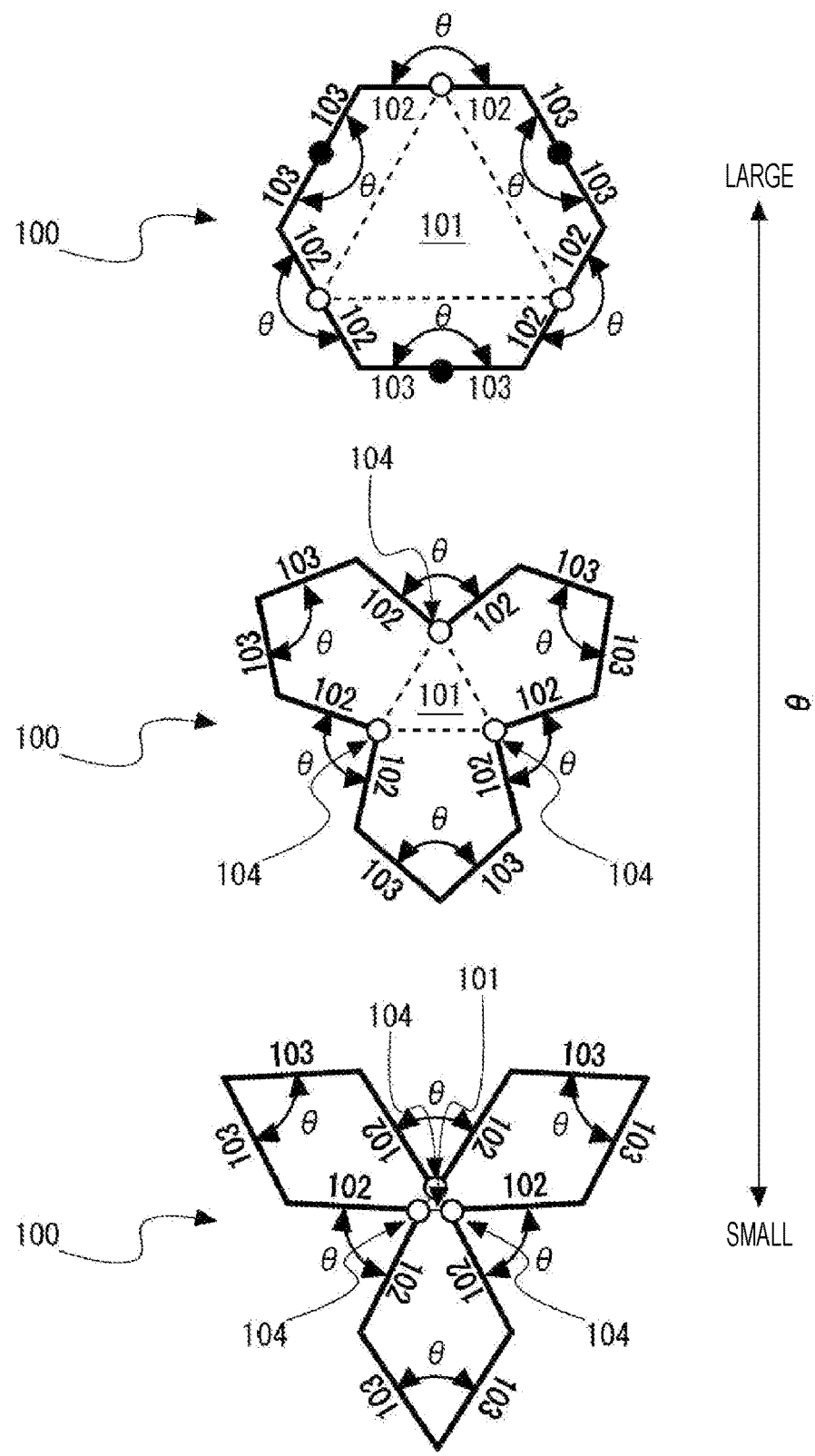
FIG. 3 is an explanatory view of the through hole formation step according to the embodiment.

FIG. 3 is an explanatory view for explaining a pattern 100 according to the embodiment. A line segment indicated by the pattern 100 is the SiC underlying substrate 10. The pattern 100 preferably presents a regular hexagonal displacement shape that is three-fold symmetric. The "regular hexagonal displacement shape" in the description of the present description will be described in detail below with reference to FIG. 3. The regular hexagonal displacement shape is a 12 polygon. Furthermore, the regular hexagonal displacement shape is constituted by 12 straight line segments having the same length. The pattern 100 having the regular hexagonal displacement shape includes a reference FIG. 101 which is regular triangle having an area 101a and including three vertices 104. Each of the three vertices 104 is included in the vertices of the pattern 100. Here, it can be understood that the three vertices 104 may be located on a line segment constituting the pattern 100. The pattern 100 includes line segments 102 (corresponding to first line segments) extending from the vertices 104 and including the vertices 104, and line segments 103 (corresponding to second line segments) not extending from the vertices 104, not including the vertices 104, and adjacent to the line segments 102. Here, an angle θ formed by two adjacent line segments 102 in the pattern 100 is constant and is equal to an angle θ formed by two adjacent line segments 103 in the pattern 100. Furthermore, the "regular hexagonal displacement shape" in the description of the present description can be understood as a 12 polygon in which the regular hexagon is displaced (deformed) while maintaining the area of the regular hexagon based on the angle θ indicating a degree of unevenness.

The angle θ is preferably more than 60°, preferably 66° or more, preferably 80° or more, preferably 83° or more, preferably 120° or more, preferably 150° or more, and preferably 155° or more. In addition, the angle θ is preferably 180° or less, preferably 155° or less, preferably 150° or less, preferably 120° or less, preferably 83° or less, preferably 80° or less, and preferably 66° or less.

The pattern 100 according to the embodiment may be configured to have a regular 12 polygonal displacement shape that is six-fold symmetric instead of the regular hexagonal displacement shape that is three-fold symmetric. The regular 12 polygonal displacement shape is a 24 polygon. Moreover, the regular 12 polygonal displacement shape is constituted by 24 straight line segments having the same length. The pattern 100 having the regular 12 polygonal displacement shape includes a reference FIG. 101 which is regular hexagon having an area 101*a* and including six vertices 104. Each of the six vertices 104 is included in the vertices of the pattern 100. Moreover, similarly to the regular hexagonal displacement shape, an angle θ formed by two adjacent line segments 102 in the pattern 100 is constant and is equal to an angle θ formed by two adjacent line segments 103 in the pattern 100. In other words, the "regular 12 polygonal displacement shape" in the description of the present description can be understood as a 24 polygon in which the regular 12 polygon is displaced (deformed) while maintaining the area of the regular 12 polygon based on the angle θ indicating the degree of unevenness. In addition, the pattern 100 may have a 2n-gonal displacement shape that is a 4n-gonal shape in which a regular 2n-gonal shape is displaced (deformed) while maintaining the area of the regular 2n-gonal shape based on an angle θ indicating the degree of unevenness. At this time, it can be understood that the 2n-gonal displacement shape includes a regular n-gonal shape (corresponding to the reference FIG. 101).

The pattern 100 according to the embodiment may be configured to include a regular 2n-gonal displacement shape (the regular hexagonal displacement shape and the regular 12 polygonal displacement shape are included). Furthermore, the pattern 100 may be configured to further include at least one line segment (corresponding to a third line segment) connecting an intersection of two adjacent line segments 103 in the regular 2n-gonal displacement shape and the center of gravity of the reference FIG. 101, in addition to the line segment constituting the regular 2n-gonal displacement shape. Moreover, the pattern 100 may be configured to further include at least one line segment connecting an intersection of two adjacent line segments 103 in the regular 2n-gonal displacement shape and the vertices 104 constituting the reference FIG. 101, in addition to the line segment constituting the regular 2n-gonal displacement shape. In addition, the pattern 100 may further include at least one line segment constituting the reference FIG. 101 included in the regular 2n-gonal displacement shape, in addition to the line segment constituting the regular 2n-gonal displacement shape.

In addition, the through hole formation step S10 is preferably a step of removing 50% or more of an effective area of the SiC underlying substrate 10. Furthermore, the step of removing 60% or more of the effective area is more preferable, the step of removing 70% or more of the effective area is further preferable, and the step of removing 80% or more of the effective area is still more preferable.

Moreover, the effective area in the present description refers to the surface of the SiC underlying substrate 10 to which a source adheres in the crystal growth step S30. In other words, it refers to a remaining region other than a region removed by the through holes 11 on a growth surface of the SiC underlying substrate 10.

<Strained Layer Removal Step>

The strained layer removal step S20 is a step of removing the strained layer 12 formed on the SiC underlying substrate 10 in the through hole formation step S10. As the strained layer removal step S20, a means for etching the SiC underlying substrate 10 by heat treating the SiC underlying substrate 10 can be exemplified.

In addition, any means capable of removing the strained layer 12 can be naturally adopted.

As a method of removing the strained layer 12, for example, a hydrogen etching method using hydrogen gas as an etching gas, a Si-vapor etching (SiVE) method of heating under a Si atmosphere, or an etching method described in Example 1 to be described later can be adopted.

<Crystal Growth Step>

The crystal growth step S30 is a step of forming the AlN layer 20 on the SiC underlying substrate 10 in which the through holes 11 are formed.

In the crystal growth step S30, as a growth method of the AlN layer 20, a known vapor phase growth method (corresponding to a vapor phase epitaxial method) such as a physical vapor transport (PVT) method, a sublimation recrystallization method, an improved Rayleigh method, a chemical vapor transport (CVT) method, a molecular-organic vapor phase epitaxy (MOVPE) method, or a hydride vapor phase epitaxy (HVPE) method can be adopted. Furthermore, in the crystal growth step S30, a physical vapor deposition (PVD) method can be adopted instead of PVT. Moreover, in the crystal growth step S30, a chemical vapor deposition (CVD) method can be adopted instead of CVT.

Figure 4:
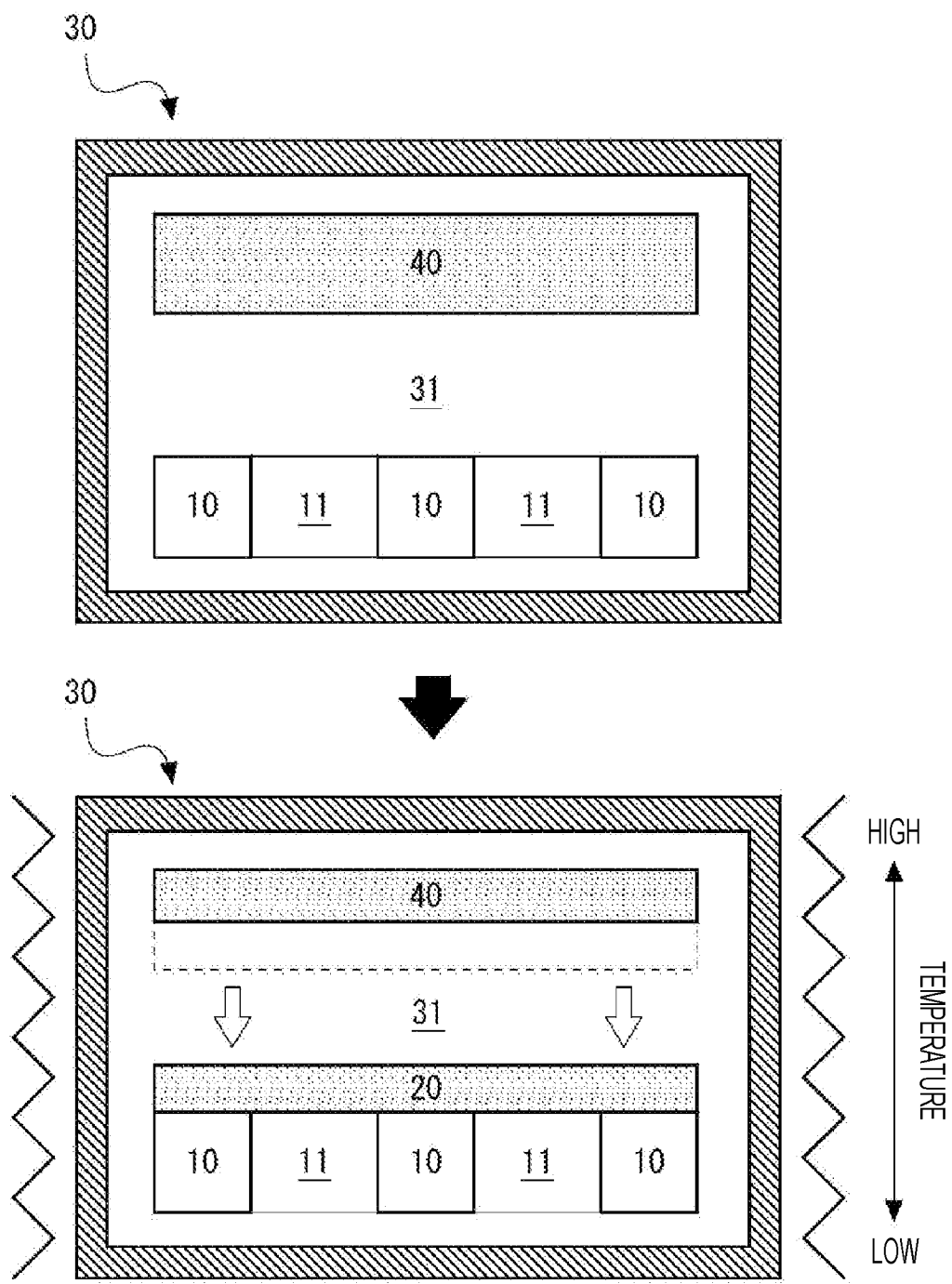
FIG. 4 is an explanatory view for explaining a crystal growth step according to the embodiment.
Figure 5:
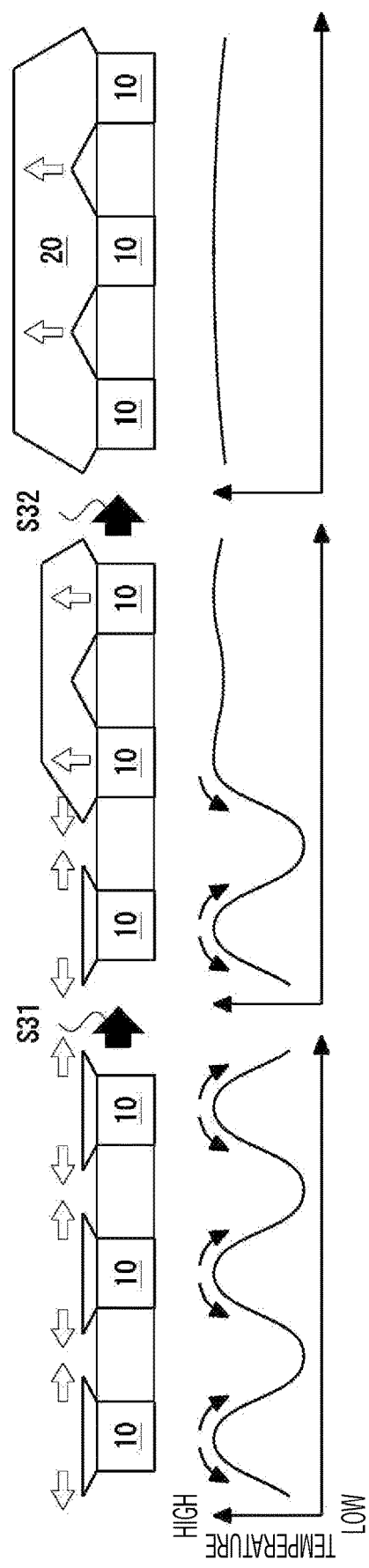
FIG. 5 is an explanatory view for explaining the crystal growth step according to the embodiment.

FIGS. 4 and 5 are explanatory views for explaining the crystal growth step S30 according to the embodiment.

The crystal growth step S30 according to the embodiment is a step in which the SiC underlying substrate 10 and a semiconductor material 40 serving as the source of the AlN layer 20 are disposed and heated in such a way as facing (confronting) each other in a crucible 30 having a quasi-closed space. Furthermore, the "quasi-closed space" in the present description refers to a space in which inside of the container can be evacuated but at least a part of the steam generated in the container can be confined.

Moreover, the crystal growth step S30 is a step of heating such that the temperature gradient is formed along the vertical direction of the SiC underlying substrate 10. By heating the crucible 30 (the SiC underlying substrate 10 and the semiconductor material 40) in this temperature gradient, the source is transported from the semiconductor material 40 onto the SiC underlying substrate 10 via a source transport space 31.

As a driving force for transporting the source, the temperature gradient described above and a chemical potential difference between the SiC underlying substrate 10 and the semiconductor material 40 can be adopted.

Specifically, in the quasi-closed space, a vapor composed of an element sublimated from the semiconductor material 40 is transported by diffusing in the source transport space 31, and is supersaturated and condensed on the SiC underlying substrate 10 set to have a temperature lower than that of the semiconductor material 40. As a result, the AlN layer 20 is formed on the SiC underlying substrate 10.

In addition, the crystal growth step S30 includes a lateral growth step S31 in which the AlN layer 20 grows in the horizontal direction of the SiC underlying substrate 10 and a longitudinal growth step S32 in which the AlN layer 20 grows in the vertical direction of the SiC underlying substrate 10.

Moreover, the lateral growth step S31 may include a growth component in the vertical direction as long as the growth component in the horizontal direction is larger than the growth component in the vertical direction (growth component: horizontal direction>vertical direction).

In addition, the longitudinal growth step S32 may include a growth component in the horizontal direction as long as the growth component in the vertical direction is larger than the growth component in the horizontal direction (growth component: vertical direction>horizontal direction).

In other words, as illustrated in FIG. 4, the lateral growth step S31 is a step in which the AlN layer 20 grows toward the through holes 11 by the heat escaping from the through holes 11 of the SiC underlying substrate 10 to form the temperature gradient in the horizontal direction on the surface of the SiC underlying substrate 10.

Thereafter, when the AlN layer 20 is formed on the through holes 11 in the lateral growth step S31, the temperature gradient in the horizontal direction decreases/disappears on the surface of the SiC underlying substrate 10, and the process automatically proceeds to the longitudinal growth step S32.

Furthermore, in this crystal growth step S30, an inert gas or a doping gas may be introduced into the source transport space 31 to control the doping concentration and growth environment of the AlN layer 20. In addition, in the crystal growth step S30, it is desirable to grow a layer inside the source transport space 31 under a nitrogen atmosphere by introducing nitrogen gas.

According to the present invention, a large-diameter AlN substrate can be manufactured by crystal-growing the AlN layer 20 on the SiC underlying substrate 10 having the through holes 11. In other words, the heat escapes from the region where the through holes 11 are formed, so that a growth driving force acts in the horizontal direction of the SiC underlying substrate 10. As a result, coupling of the AlN layer 20 is promoted on the region where the through holes 11 are formed, and the AlN layer 20 having a diameter equivalent to that of the SiC underlying substrate 10 can be formed. Therefore, by adopting the SiC underlying substrate 10 having a large diameter, the AlN substrate having a large diameter can be obtained.

Furthermore, according to the present invention, the crystallinity of the AlN layer 20 can be improved by forming the AlN layer 20 on the region where the through holes 11 are formed. In other words, the AlN layer 20 formed on the region where the through holes 11 are formed is not located immediately above the SiC underlying substrate 10. Therefore, it is possible to reduce a dislocation of a threading system in the AlN layer 20 without taking over the dislocation (for example, threading screw dislocations, threading edge dislocations, micropipes, and the like) of the threading system existing in the SiC underlying substrate 10.

EXAMPLES

The present invention will be described more specifically with reference to Example 1 and Comparative Example 1.

Example 1

<Through Hole Formation Step>
The SiC underlying substrate 10 was irradiated with a laser under the following conditions to form the through holes 11.
(SiC underlying substrate 10)
  Semiconductor material: 4H-SiC
  Substrate size: width 11 mm×length 11 mm×thickness 524 μm
  Growth surface: Si-face
  Off angle: on-axis
(Laser Processing Conditions)
  Type: green laser
  Wavelength: 532 nm
  Spot diameter: 40 μm
  Average output: 4 W (at 30 kHz)
(Pattern Details)
FIG. 6 is an explanatory view for explaining a pattern of the through holes 11 formed in the through hole formation step S10 according to Example 1. FIG. 6(a) is an explanatory view illustrating a state in which the plurality of through holes 11 is arranged. In FIG. 6(a), black regions indicate a portion of the through holes 11, and white regions remain as the SiC underlying substrate 10.

FIG. 6(b) is an explanatory view illustrating a state in which the through holes 11 of FIG. 6(a) are enlarged. In FIG. 6(b), white regions indicate a portion of the through holes 11, and black regions remain as the SiC underlying substrate 10.

Figure 7:
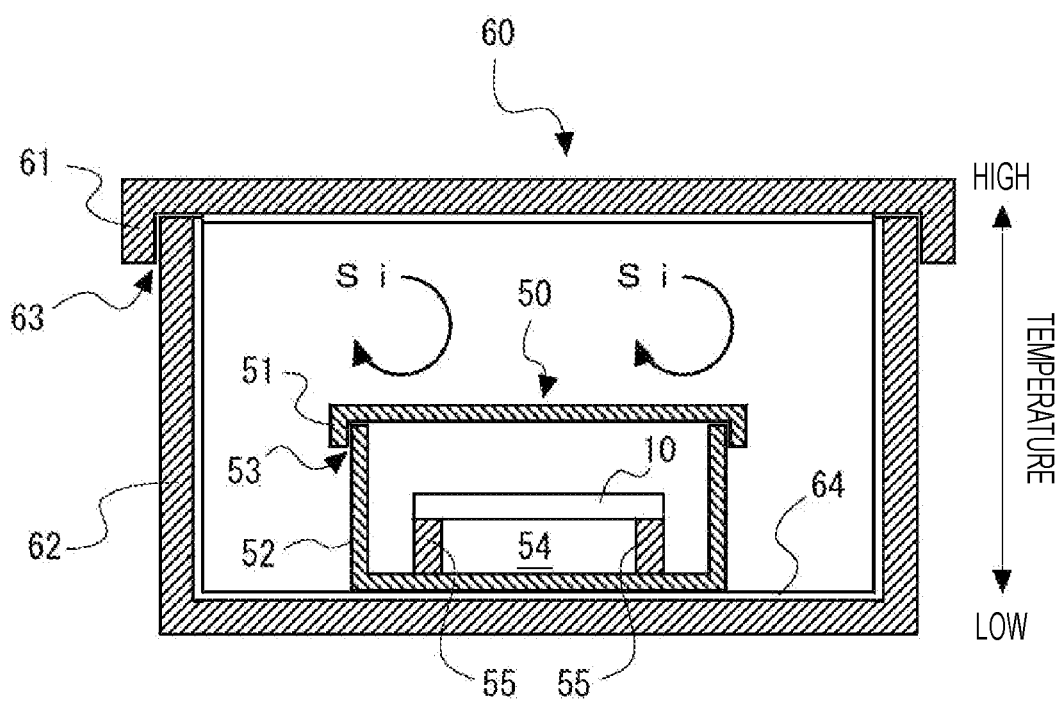
FIG. 7 is an explanatory view of a strained layer removal step according to Example 1.

In addition, in the pattern of FIG. 6, 80% or more of the effective area of the SiC underlying substrate 10 is removed to lower the strength of the SiC underlying substrate 10.
(Strained Layer Removal Step S20)
FIG. 7 is an explanatory view for explaining the strained layer removal step S20 according to Example 1.

The SiC underlying substrate 10 having the through holes 11 formed in the through hole formation step S10 was housed in a SiC container 50, the SiC container 50 was housed in a TaC container 60, and they were heated under the following conditions.
(Heating Conditions)
  Heating temperature: 1800° C.
  Heating time: 2 hours
  Etching amount: 8 μm
(SiC Container 50)
  Material: polycrystalline SiC
  Container size: diameter 60 mm×height 4 mm
  Distance between the SiC underlying substrate 10 and bottom surface of the SiC container 50: 2 mm
(Details of SiC container 50)
As illustrated in FIG. 5, the SiC container 50 is a fitting container including an upper container 51 and a lower container 52 that can be fitted to each other. A gap 53 is formed in a fitting portion between the upper container 51 and the lower container 52, and the SiC container 50 can be exhausted (evacuated) from the gap 53.

The SiC container 50 has an etching space 54 formed by making a part of the SiC container 50 arranged on the low temperature side of the temperature gradient face the SiC underlying substrate 10 in a state where the SiC underlying substrate 10 is arranged on the high temperature side of the temperature gradient. The etching space 54 is a space for transporting and etching Si atoms and C atoms from the SiC underlying substrate 10 to the SiC container 50 using a temperature difference provided between the SiC underlying substrate 10 and the bottom surface of the SiC container 50 as the driving force.

Furthermore, the SiC container 50 includes a substrate holder 55 that holds the SiC underlying substrate 10 in a hollow state to form the etching space 54. In addition, the substrate holder 55 may not be provided depending on a direction of the temperature gradient of a heating furnace. For example, when the heating furnace forms a temperature gradient such that the temperature becomes lower from the lower container 52 toward the upper container 51, the SiC underlying substrate 10 may be disposed on the bottom surface of the lower container 52 without providing the substrate holder 55.

(TaC Container 60)
  Material: TaC
  Container size: diameter 160 mm×height 60 mm
  Si vapor supply source 64 (Si compound): $TaSi_2$
(Details of TaC Container 60)

Similarly to the SiC container 50, the TaC container 60 is a fitting container including an upper container 61 and a lower container 62 that can be fitted to each other, and is configured to be able to house the SiC container 50. A gap 63 is formed in a fitting portion between the upper container 61 and the lower container 62, and the TaC container 60 can be exhausted (evacuated) from the gap 63.

The TaC container 60 includes the Si vapor supply source 64 capable of supplying vapor pressure of a vapor phase type containing Si element into the TaC container 60. The Si vapor supply source 64 may be configured to generate vapor pressure of the vapor phase type containing Si element in the TaC container 60 during heat treatment.

<Crystal Growth Step S30>

FIG. 8 is an explanatory view for explaining the crystal growth step S30 according to Example 1.

The SiC underlying substrate 10 from which the strained layer 12 has been removed in the strained layer removal step S20 was housed in the crucible 30 while facing the semiconductor material 40, and was heated under the following conditions.

(Heating Conditions)
  Heating temperature: 2040° C.
  Heating time: 70 hours
  Growth thickness: 500 μm
  $N_2$ gas pressure: 10 kPa
(Crucible 30)
  Material: tantalum carbide (TaC) and/or tungsten (W)
  Container size: 10 mm×10 mm×1.5 mm
  Distance between the SiC underlying substrate 10 and the semiconductor material 40: 1 mm
(Details of Crucible 30)

The crucible 30 has a source transport space 31 between the SiC underlying substrate 10 and the semiconductor material 40. The source is transported from the semiconductor material 40 onto the SiC underlying substrate 10 through the source transport space 31.

FIG. 8(*a*) is an example of the crucible 30 to be used in the crystal growth step S30. Similarly to the SiC container 50 and the TaC container 60, the crucible 30 is a fitting container including an upper container 32 and a lower container 33 that can be fitted to each other. A gap 34 is formed in a fitting portion between the upper container 32 and the lower container 33, and the crucible 30 can be exhausted (evacuated) from the gap 34.

Further, the crucible 30 includes a substrate holder 35 that forms the source transport space 31. The substrate holder 35 is provided between the SiC underlying substrate 10 and the semiconductor material 40, and forms the source transport space 31 by arranging the semiconductor material 40 on the high temperature side and the SiC underlying substrate 10 on the low temperature side.

FIGS. 8(*b*) and 8(*c*) are another example of the crucible 30 to be used in the crystal growth step S30. The temperature gradient in FIGS. 8(*b*) and 8(*c*) is set opposite to the temperature gradient in FIG. 8(*a*), and the SiC underlying substrate 10 is disposed on an upper side. In other words, similarly to FIG. 8(*a*), the semiconductor material 40 is disposed on the high temperature side, and the SiC underlying substrate 10 is disposed on the low temperature side to form the source transport space 31.

FIG. 8(*b*) illustrates an example in which the SiC underlying substrate 10 is fixed to the upper container 32 side to form the source transport space 31 with the semiconductor material 40.

FIG. 8(*c*) illustrates an example in which the source transport space 31 is formed between the semiconductor material 40 and the SiC underlying substrate 10 by forming a through window in the upper container 32 and arranging the underlying substrate. Furthermore, as illustrated in FIG. 8(*c*), an intermediate member 36 may be provided between the upper container 32 and the lower container 33 to form the source transport space 31.

(Semiconductor Material 40)
  Material: AlN sintered body
  Size: width 20 mm×length 20 mm×thickness 5 mm
(Details of Semiconductor Material 40)

The AlN sintered body of the semiconductor material 40 was sintered in the following procedure.

Figure 9:
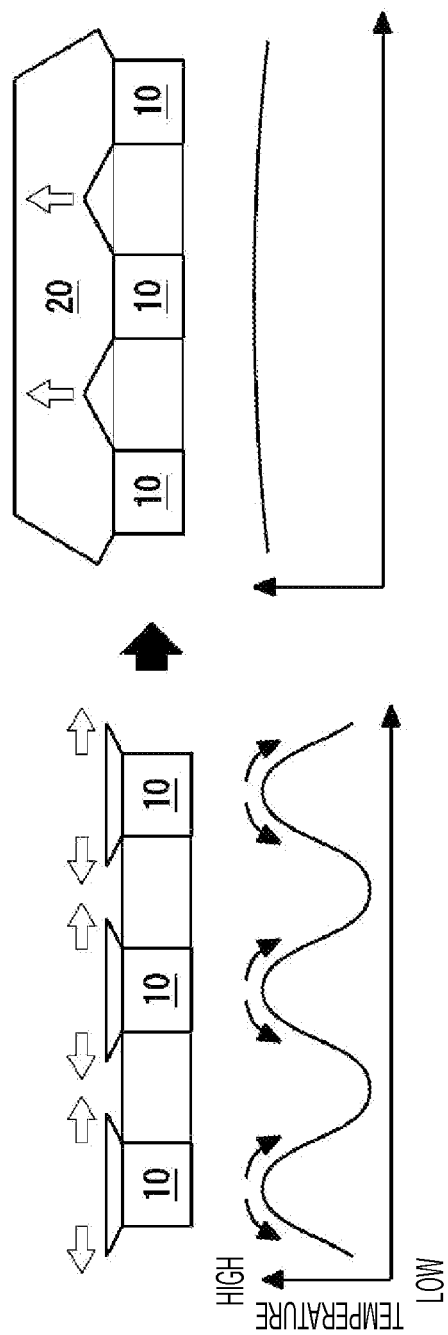
FIG. 9 is an explanatory view of the crystal growth step according to Example 1.

The AlN powder was placed in a frame of a TaC block and compacted with an appropriate force. Thereafter, the compacted AlN powder and the TaC block were housed in a thermal decomposition carbon crucible and heated under the following conditions.
  Heating temperature: 1850° C.
  $N_2$ gas pressure: 10 kPa
  Heating time: 3 hours FIG. 9 is a schematic view showing a crystal growth step S30 of Example 1. By crystal-growing the AlN layer 20 with respect to the SiC underlying substrate 10 in which the through holes 11 are formed, the temperature gradient can be formed in the horizontal direction of the SiC underlying substrate 10 and used as a driving force for the lateral growth of the AlN layer 20. In other words, even in the case of a semiconductor material such as AlN in which the crystal growth in the horizontal direction is difficult, the AlN layer 20 can be formed on the region where the through holes 11 are formed, and a large-diameter AlN substrate can be manufactured.

Moreover, in the AlN substrate manufactured according to Example 1, no threading system dislocation was found in the AlN layer 20 formed on the region where the through holes 11 are formed.

Comparative Example 1

In the SiC underlying substrate 10 according to Comparative Example 1, a groove 13 was formed instead of the through holes 11 of Example 1. The SiC underlying substrate 10 was subjected to the crystal growth step S30 under the same conditions as in Example 1. In other words, in Comparative Example 1, the crystal growth step S30 was performed without performing the through hole formation step S10.

FIG. 10 is a schematic view showing the crystal growth step S30 of Comparative Example 1. In the AlN substrate manufactured according to Comparative Example 1, a region in which the AlN layer 20 did not grow was formed on the groove 13.

In other words, when the groove 13 was formed instead of the through holes 11, the temperature in the region of the groove 13 does not become lower, and the temperature gradient is not formed in the horizontal direction of the SiC underlying substrate 10. As a result, it is considered that the growth driving force in the lateral direction is not generated and the AlN layer 20 is not formed in the region of the groove 13.

From the results of Example 1 and Comparative Example 1, it can be understood that a large-diameter AlN substrate can be manufactured by forming the AlN layer 20 on the SiC underlying substrate 10 having the through holes 11.

10 SiC underlying substrate
11 Through hole
12 Strained layer
13 Groove
20 AlN layer
30 Crucible
31 Source transport space
40 Semiconductor material
50 SiC container
60 TaC container
S10 Through hole formation step
S20 Strained layer removal step
S30 Crystal growth step
S31 Lateral growth step
S32 Longitudinal growth step

The invention claimed is:

1. A method for manufacturing an aluminum nitride substrate, the method comprising a crystal growth step of forming an aluminum nitride layer on a silicon carbide underlying substrate having through holes, wherein the crystal growth step comprises disposing the silicon carbide underlying substrate and a source of the aluminum nitride layer to face each other and heating the silicon carbide underlying substrate and the source in such a way to form a temperature gradient between the silicon carbide underlying substrate and the source.

2. The method for manufacturing an aluminum nitride substrate according to claim 1, wherein the crystal growth step is a step of heating such that a temperature gradient is formed along a vertical direction of the silicon carbide underlying substrate.

3. The method for manufacturing an aluminum nitride substrate according to claim 1, wherein the crystal growth step includes a lateral growth step of growing the aluminum nitride layer in a horizontal direction of the silicon carbide underlying substrate, and a longitudinal growth step of growing the aluminum nitride layer in a vertical direction of the silicon carbide underlying substrate.

4. The method for manufacturing an aluminum nitride substrate according to claim 1, the method further comprising:
a through hole formation step of forming through holes in the silicon carbide underlying substrate; and
a strained layer removal step of removing a strained layer introduced in the through hole formation step.

5. The method for manufacturing an aluminum nitride substrate according to claim 4, wherein the through hole formation step is a step of forming the through holes by irradiating the silicon carbide underlying substrate with a laser.

6. The method for manufacturing an aluminum nitride substrate according to claim 4, wherein the strained layer removal step is a step of removing a strained layer of the silicon carbide underlying substrate by heat treatment.

7. The method for manufacturing an aluminum nitride substrate according to claim 4, wherein the strained layer removal step is a step of etching the silicon carbide underlying substrate under a silicon atmosphere.

8. A method of forming an aluminum nitride layer, the method comprising:
a through hole formation step of forming through holes in a silicon carbide underlying substrate before forming an aluminum nitride layer on a surface of the silicon carbide underlying substrate, and
a crystal growth step of forming the aluminum nitride layer on the silicon carbide underlying substrate having through holes, wherein the crystal growth step comprises disposing the silicon carbide underlying substrate and a source of the aluminum nitride layer to face each other and heating the silicon carbide underlying substrate and the source in such a way to form a temperature gradient between the silicon carbide underlying substrate and the source.

9. The method according to claim 8, comprising a strained layer removal step of removing a strained layer introduced in the through hole formation step.

10. The method according to claim 9, wherein the strained layer removal step is a step of etching the silicon carbide underlying substrate by heat treatment.

11. The method for manufacturing an aluminum nitride substrate according to claim 2, wherein the crystal growth step is a step of disposing the silicon carbide underlying substrate and a source of the aluminum nitride layer to face each other and heating the silicon carbide underlying substrate and the source in such a way to form the temperature gradient between the silicon carbide underlying substrate and the source.

12. The method for manufacturing an aluminum nitride substrate according to claim 2, wherein the crystal growth step includes a lateral growth step of growing the aluminum nitride layer in a horizontal direction of the silicon carbide underlying substrate, and a longitudinal growth step of growing the aluminum nitride layer in a vertical direction of the silicon carbide underlying substrate.

13. The method for manufacturing an aluminum nitride substrate according to claim 11, wherein the crystal growth step includes a lateral growth step of growing the aluminum nitride layer in a horizontal direction of the silicon carbide underlying substrate, and a longitudinal growth step of growing the aluminum nitride layer in a vertical direction of the silicon carbide underlying substrate.

14. The method for manufacturing an aluminum nitride substrate according to claim 13, the method further comprising:
a through hole formation step of forming through holes in the silicon carbide underlying substrate; and
a strained layer removal step of removing a strained layer introduced in the through hole formation step.

15. The method for manufacturing an aluminum nitride substrate according to claim 14, wherein the through hole formation step is a step of forming the through holes by irradiating the silicon carbide underlying substrate with a laser.

16. The method for manufacturing an aluminum nitride substrate according to claim 15, wherein the strained layer removal step is a step of removing a strained layer of the silicon carbide underlying substrate by heat treatment.

17. The method for manufacturing an aluminum nitride substrate according to claim 16, wherein the strained layer removal step is a step of etching the silicon carbide underlying substrate under a silicon atmosphere.

18. A method of forming an aluminum nitride layer, the method comprising:
    a crystal growth step of forming the aluminum nitride layer on a silicon carbide underlying substrate having through holes, wherein the crystal growth step comprises disposing the silicon carbide underlying substrate and a source of the aluminum nitride layer to face each other and heating the silicon carbide underlying substrate and the source in such a way to form a temperature gradient between the silicon carbide underlying substrate and the source.

\* \* \* \* \*